(12) United States Patent
Allemand et al.

(10) Patent No.: US 10,897,022 B2
(45) Date of Patent: Jan. 19, 2021

(54) ORGANIC SOLAR MODULE AND/OR FABRICATION METHOD

(71) Applicant: CAM HOLDING CORPORATION, Tortola (VG)

(72) Inventors: Pierre-Marc Allemand, San Jose, CA (US); Rahul Gupta, Fremont, CA (US); Hans-Joachim Egelhaaf, Nuremberg (DE); Pin-Chu Chen, Sunnyvale, CA (US); Michael Wagner, Nuremberg (DE); Philipp Maisch, Fladungen (DE); Karl Pichler, Admont-Hall (AT); Kai Cheong Tam, Tsuen Wan (HK); Peter Kubis, Nuremberg (DE)

(73) Assignee: Cambrios Film Solutions Corporation, Tortola (VG)

( * ) Notice: Subject to any disclaimer, the term of this patent is extended or adjusted under 35 U.S.C. 154(b) by 76 days.

(21) Appl. No.: 16/012,162

(22) Filed: Jun. 19, 2018

(65) Prior Publication Data
US 2018/0366670 A1 Dec. 20, 2018

Related U.S. Application Data

(60) Provisional application No. 62/521,696, filed on Jun. 19, 2017.

(51) Int. Cl.
  *H01L 51/44* (2006.01)
  *H01L 51/00* (2006.01)
  *H01L 51/42* (2006.01)

(52) U.S. Cl.
  CPC ........ *H01L 51/441* (2013.01); *H01L 51/0037* (2013.01); *H01L 51/4253* (2013.01);
  (Continued)

(58) Field of Classification Search
  None
  See application file for complete search history.

(56) References Cited

U.S. PATENT DOCUMENTS 8,546,684 B2 * 10/2013 Nojima ................ H01L 51/441
                                                     136/256
2015/0083224 A1   3/2015 Fogel et al.

FOREIGN PATENT DOCUMENTS

CN    102586748 A    7/2012
JP    2010251592 A   11/2010
(Continued)

OTHER PUBLICATIONS

Zhang et al., low work function poly34ethylenediosylenethiophene:polystyrene sulfonate as ETL for high efficient and stable polymer solar cells; scientific reports, 5, pub Aug. 4, 2015 (Year: 2015).*

(Continued)

*Primary Examiner* — Shannon M Gardner
(74) *Attorney, Agent, or Firm* — Cooper Legal Group, LLC

(57) ABSTRACT

According to some embodiments, an organic device and method of forming an organic device are disclosed. A hybrid cathode layer is formed in stacked alignment with a substrate. The hybrid cathode layer includes a combination of a conductive nanowire and an electron-transport material. After forming the hybrid cathode layer, a photoactive layer is formed on a structure that includes the substrate and the hybrid cathode layer. After forming the photoactive layer, a hybrid anode layer that is separated from the hybrid cathode layer by the photoactive layer is formed. The hybrid anode layer includes a combination of a conductive nanowire and a hole-transporting material.

20 Claims, 4 Drawing Sheets

(52) U.S. Cl.
CPC ...... *H01L 51/4266* (2013.01); *H01L 51/4273* (2013.01); *H01L 51/442* (2013.01)

(56) References Cited

FOREIGN PATENT DOCUMENTS

| | | |
|---|---|---|
| JP | 2010258205 A | 11/2010 |
| JP | 2009113342 A1 | 7/2011 |
| JP | 2014505963 A | 3/2014 |
| JP | 2016149472 A | 8/2016 |
| JP | 2017500741 A | 1/2017 |
| JP | 2017006798 A1 | 5/2018 |
| KR | 20160010655 A | 1/2016 |
| TW | M569081 U | 10/2018 |
| WO | 2009113342 A1 | 7/2011 |
| WO | 2017006798 A1 | 1/2017 |
| WO | 2018079323 A1 | 5/2018 |

OTHER PUBLICATIONS

"Roll-to-Roll Printed Silver Nanowire Semitransparent Electrodes for fully Ambient Solution-Processed Tandem Polymer Solar Cells"; 2015; D. Angmo, T.R. Bentzen, J.J. Helgesen, M. Sondergaard, R.R. Jergensen, M. Carle, J. Bundgaard, and E. Krebs; Advanced Functional Materials; 10 pgs.

"Solution-Processed Flexible Polymer Solar Cells with Silver Nanowire Electrodes"; 2011; L. Yang, T. Zhang, H. Zhou, S.C. Price, B.J.. Wiley, B.J and W. You; ACS Applied Materials; 10 pgs.

"Highly Robust Indium-Free Transparent conductive Electrodes Based on Composites of Silver Nanowires and Conductive Metal Oxides"; 2014; K. Zilberberg, F. Gasse, R.Pagui, A. Polywka, A. Behrendy,S.Trost, R. Heiderhoff, P. Gorrn and T. Riedl; Advanced Functional Materials; 9 pgs.

"Chemical Properties of Electrosprayed Antimony Tin Oxide Thin Film/Ag Nanowire Mltilayer for Transparent Conductive Electrodes", Jun. 27, 2014, Bon-Ryul Koo and Hyo-Jin Ahn, Applied Physics Express, vol. 7, No. 7, 5 pgs.

"Structural, Morphological, Electrical and Optical Properties of SnO2 Nanoparticles: Influence of Sb Doping", Mar. 2016, S. Liu, J. Liu, B. Wen, W. Jiang, C. Liu, W. Ding, H. Wang, N. Wang, A. Zhang and W. Chai, Journal of Materials Science, Materials in Electronics, Chapman and Hall, London, vol. 27, No. 7, 7 pgs.

"Improved Long-Term Stability of Transparent Conducting Electronics Based on Double-Laminated Electrosprayed Antimony Tin Oxides and Ag Nanowires", Jul. 2007, B.R. Koo, J.W. Bae and H.J. Ahn, Archives of Metallurgy and Materials, vol. 62, No. 2, 6 pgs.

Int. Search Report/Written Opinion cited in PCT Application No. PCT/IB2018/001454 dated May 22, 2019, 13 pgs.

Yong-Jin Noh et al., "Cost-effective ITO-free organic solar cells with silver nanowire—PEDOT:PSS composite electrodes via a one-step spray deposition method", Solar Energy Materials & Solar Cells, 2014年, vol. 120, pp. 226-230.

* cited by examiner

ORGANIC SOLAR MODULE AND/OR FABRICATION METHOD

RELATED APPLICATION(S)

This application claims the benefit of U.S. Provisional Application 62/521,696, titled "ORGANIC SOLAR MODULE AND/OR FABRICATION METHOD" and filed on Jun. 19, 2017, which is incorporated herein by reference.

FIELD

This application relates generally to an organic photovoltaic device and a method of fabricated an organic photovoltaic device that includes a photovoltaic circuit having three discrete layers including two hybrid electrodes and a photoactive layer there between.

BACKGROUND

Demands for renewable energy such as that generated by photovoltaic technology are expected to increase significantly in the future. Conventional silicon-based photovoltaics (PV) offer favorable electrical output properties, but are too expensive to be practically implemented on a large scale. Technologies such as organic photovoltaics ("OPVs") show promise due to the large-scale fabrication of such devices, which can be achieved by roll-to-roll manufacturing from solution. However, conventional processes to manufacture OPVs are limited by the complexity of coating multilayer structures with tolerable defects and thicknesses in the nanometer range over a large area, and the inability to pattern such layers. These problems are exacerbated by each layer of the device that introduces the opportunity for defects to be formed in the device, rendering the device inoperable. Such problems greatly affect the production yield and narrow the processing window of OPV devices, particularly large area module fabrication.

BRIEF SUMMARY

According to one aspect, the subject application involves an organic photovoltaic device formed from a substrate, and optionally three or fewer layers that include two hybrid electrode layers. The hybrid electrode layers are each formed from compositions including silver nanowires. The organic photovoltaic device includes a substrate, and a photovoltaic circuit supported by the substrate. The photovoltaic circuit comprising three layers, wherein the three layers comprise, consist essentially of, or consist of: (i) a first hybrid electrode formed from a blend of electrically conductive nanowires and a hole transporting and/or electron blocking material that carries positive charges, (ii) a second hybrid electrode formed from a blend of electrically-conductive nanowires and an electron transporting and/or hole blocking material that carries negative charges, and (iii) a photoactive layer disposed between the first electrode and the second electrode.

There can optionally be no intermediary layers disposed between the first hybrid electrode and the substrate, and/or between the second hybrid electrode and the substrate. Further, the organic photovoltaic device can optionally be devoid of a separate nanowire-containing electrode, that lacks the blended material such as a metal oxide or PEDOT, for example. In other words, both the first and second hybrid electrodes can constitute all the electrodes of the organic photovoltaic device.

For some embodiments, however, one of the electrodes can be formed from a nanowire material that is not blended with PEDOT or a metal oxide, for example. For such embodiments, the PEDOT or metal oxide can be formed as a layer coated onto a layer comprising the nanowire material.

According to another aspect, the subject application involves a method of forming an organic photovoltaic device. The method includes forming a hybrid cathode layer in stacked alignment with a substrate. The hybrid cathode layer is formed from a combination of a conductive nanowire and an electron-transport material. The electron-transport material exhibits a preference to conduct electrons and impede a flow of holes. After forming the hybrid cathode layer, a photoactive layer is formed on a structure that includes the substrate and the hybrid cathode layer. After forming the photoactive layer, a hybrid anode layer is formed, and is separated from the hybrid cathode layer by the photoactive layer. The hybrid electrode layer includes a combination of a conductive nanowire and a hole-transporting material. The hole-transporting material exhibits a preference to conduct holes and impede a flow of electrons.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

BRIEF DESCRIPTION OF SEVERAL VIEWS OF THE DRAWING

The disclosed subject matter may take physical form in certain parts and arrangement of parts, embodiments of which will be described in detail in this specification and illustrated in the accompanying drawings which form a part hereof and wherein.

DETAILED DESCRIPTION

Figure 1:
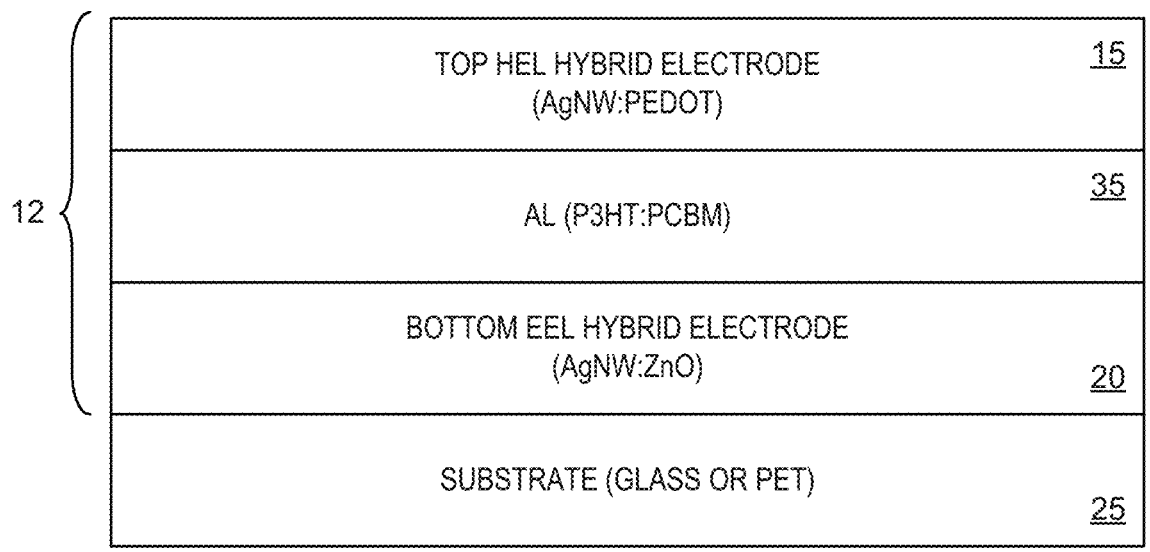
FIG. 1 shows a sectional view of an embodiment of a three layer structured OPV including hybrid electrodes on a substrate.

Certain terminology is used herein for convenience only and is not to be taken as a limitation on the disclosed subject matter. Relative language used herein is best understood with reference to the drawings, in which like numerals are used to identify like or similar items. Further, in the drawings, certain features may be shown in somewhat schematic form.

Within recent years significant attention has been given to improve photovoltaic technology in order to meet the rising demands for renewable energy generation. While further expansion of conventional silicon photovoltaics (PV) technology is limited mainly due to high production cost, inexpensive technologies are in the focus of current research. One of the technologies, promising to reduce energy cost to less than 25 ct/Wp, is organic photovoltaics (OPV) for their high throughput fabrication which can be achieved by roll-to-roll manufacturing from solution.

However, development of such processes is considered to be challenging due to the complexity of coating multilayer structures with tolerable defects and thicknesses in the nanometer range over a large area and to pattern these layers afterwards. These problems are exacerbated when the process has to be repeated often to form all of the required layers. This greatly affects the production yield and narrows the processing window of OPV devices, particularly large area module fabrication.

By combining the role of both transparent electrodes and the respective charge extraction layers, the fabrication process can be significantly simplified. It is possible to fabricate transparent/semitransparent charge selective electrodes for OPV by blending with other materials or by improving the conductivity of the charge extraction layer. However such fabrication techniques are believed to be limited to single composite electrode fabrication while the other electrode is either thermally evaporated or formed by extraction/conductor combination. For such techniques, at least four discrete layers are required.

The present solution involves fabrication techniques and OPV devices including a photovoltaic circuit including fewer than four primary layers, such as three discrete layers, for example. Up to three layers can be stacked together, and coupled to each other to form a portion of the photovoltaic circuit. The three layers can optionally be mounted or otherwise formed on a glass or other suitable substrate, which can optionally be transparent or partially transparent. According to such embodiments, an EE hybrid electrode, a HE hybrid electrode and the photoactive layer can form the three layers. Generally, the photovoltaic circuit described herein can include three discrete layers in a stacked alignment. An embodiment of the three layers of the photovoltaic circuit can include: (i) a first hybrid electrode that is optionally substantially transparent, and is formed from a blend of a conductive nanowire ("NW") and an organic and/or inorganic hole-transporting/electron-blocking material, for example, that carries positive charges; (ii) a second hybrid electrode layer that is formed as a layer of a blend of a conductive NW and an electron-transporting/hole-blocking material that is substantially transparent, exhibits high electron mobility and has a wide bandgap; and (iii) a photoactive layer disposed between the first and second hybrid electrodes. Each layer can optionally be formed as a separate, individual layer, coated as a separate process onto an underlying layer that was previously deposited, coated or otherwise formed.

Although the structures are described herein as OPV devices including a photovoltaic circuit that receives light and converts that light into positive and negative charges output by the hybrid electrodes, the present disclosure is not so limited. According to alternate embodiments, the structures can be constructed as organic light emitting diodes ("OLED") that receive positive and negative charges at the hybrid electrodes, and convert the received charges as light that is output by the photoactive layer, which functions as a light-emitting layer of the OLED device in response to being energized by charges input to the hybrid electrodes. Thus, one of the primary differences between the two types of structures is whether the electric charges constitute the input or output of the hybrid electrodes provided to the photovoltaic circuit. A controller configured to control a supply of electric charges to the hybrid electrodes can be provided to operate the structures described herein as OLED devices instead of as OPV devices. According to such embodiments, the hybrid electrodes described below as extracting charges or transporting charges from the photoactive layer would instead be charge-injecting structures. For the sake of brevity and clarity, however, the structures will hereinafter be described as OPV devices.

According to one or more embodiments, the OPV device 10 can include a photovoltaic circuit 12 supported by a transparent substrate 25, the photovoltaic circuit 12 can include a planar assembly of circuit layers. This planar assembly of circuit layers can include, consist essentially of, or consist of: (i) the first hybrid electrode that carries positive charges, (ii) a second hybrid electrode that carries negative charges, and (iii) a photoactive layer disposed between the first electrode and the second electrode.

More specifically, with reference to FIG. 1, an embodiment of a three-layer photovoltaic circuit 12 provided to an OPV device 10 is shown. The photovoltaic circuit 12 includes a photoactive layer 35 disposed between two hybrid electrode layers 15, 20. The layers of the photovoltaic circuit 12 are shown bonded to a substantially-transparent substrate 25. To be considered substantially transparent, at least a portion, and optionally most of light impinging on the substrate 25 is transmitted there through. Although embodiments of the substrate are described as being substantially transparent (e.g., glass, various plastic films such as Polyethylene terephthalate ("PET"), etc.), other embodiments of the substrate can be opaque (e.g. including a metal foil, metallized plastic foil, etc.). According to such other embodiments that include an opaque substrate 25, light can enter the OPV device 10 and reach the photoactive layer 35 through the hybrid electrode layer 15, which is arranged on an opposite side of the photoactive layer 35 from the hybrid electrode layer 20 applied to the substrate 25 in FIG. 1. Similarly, for embodiments constructed as an OLED device, light can be emitted from the device through the hybrid electrode layer 15 instead of through the hybrid electrode layer 20 mounted on an opaque substrate.

The photovoltaic circuit 12 shown in FIG. 1 is configured in accordance with an inverted architecture. As such, the hybrid electrode layer 20 is a cathode formed as a singular, continuous layer through deposition of a blended cathode material onto the substrate 25. The blended cathode material used to form the hybrid electrode layer 20 includes a combination of: (i) an electron-transporting and/or hole-blocking material that exhibits a preference to conduct electrons while serving as an impediment to a flow of holes, and (ii) a conductive NW material. The blended cathode material used to form the hybrid electrode layer 20 is prepared prior to being applied to the substrate 25. Once prepared, the blended cathode material is then coated onto a region of the substrate 25, for example, to form the continuous hybrid electrode layer 20 of the photovoltaic circuit 12. Formed from the blended cathode material, the hybrid electrode layer 20 serves as both an electron transport layer ("ETL") and an electrode.

The conductive NW material can include strands of a crystalline metal suspended in a fluid medium such as a substantially-transparent ink, for example. The strands can be formed of any metal such as silver, selected for its high electrical conductivity. The strands can be elongated structures, having an average diameter from about ten (10 nm) nanometers to about one hundred (100 nm) nanometers, and an average length of at least one (1 μm) micrometer. When the conductive NW material with the suspended metal strands is coated onto a surface, the resulting film includes a network of highly-conductive metal nanowires that is substantially transparent (e.g., transmits a majority of light imparted thereon when observed by a human observer).

Embodiments of the electron transporting and/or hole blocking material can include one or more of: (i) an electron-transporting/hole-blocking inorganic nanoparticle, (ii) an organic ETL material such as non-conjugated polyethylenimine ethoxylated ("PEIE") for example, or (iii) a composite that includes two or more of a nanowire, inorganic ETL material and organic ETL material. More specifically, the electron transport material can include oxides of Zn, Ti, Sn, as well as doped preparations of such oxides. Examples of the doped preparations include, but are not limited to aluminum-doped zinc oxide ("AZO"), antimony-doped tin oxide, etc.

The photoactive layer 35 converts received light into electric charges that are ultimately output by the hybrid electrodes 15, 20. The photoactive layer 35 can optionally be formed from a composition that includes one or more organic photoactive materials such as a blend of P3HT:PCBM, for example. According to another embodiment, the photoactive layer 35 can be formed from a composition including an inorganic photoactive material such as an inorganic perovskite material, or a perovskite material comprising both an organic material and an inorganic material in combination, for example. Regardless of the makeup of the photoactive layer 35, the photoactive layer 35 can be wet coated onto the hybrid electrode layer 20 that was previously coated onto the substrate 25. According to yet other embodiments, the photoactive layer 35 may not be an organic PV device, but instead could be one or more photo-active semiconductor(s), which can be inorganic, e.g. dye-sensitized photo-active device (DSSC), a perovskite-PV device or generally other thin-film organic or inorganic or hybrid PV device structure.

In the inverted architecture, the hybrid electrode layer 15 is an anode formed as a singular, continuous layer through deposition of a blended anode material onto the photoactive layer 35, which itself was coated onto the hybrid electrode layer 20 on the substrate 25. The blended anode material used to form the hybrid electrode layer 15 includes a combination of: (i) a hole-transporting and/or electron-blocking material that exhibits a preference to conduct holes while establishing an impediment to a flow of electrons, and (ii) a conductive NW material. The blended anode material used to form the hybrid electrode layer 15 is prepared prior to being applied to the photoactive layer 35. Once prepared, the blended anode material is then coated onto a region of the photoactive layer 35, for example, to form the hybrid electrode layer 15 of the photovoltaic circuit 12. Formed from the blended anode material, the hybrid electrode layer 15 serves as both a hole extraction layer and an electrode.

The conductive NW material included in the blended anode material can optionally be the same as the conductive NW material included in the blended cathode material. Such a material is described herein as including strands of a metal such as silver suspended in a fluid medium such as a substantially-transparent ink.

Embodiments of the hole transporting and/or electron blocking material can include one or more of: (i) any organic hole-transporting and/or electron blocking material such as a conjugated polymer comprising poly(3,4-ethylenedioxythiophene) ("PEDOT"), more specifically, a blend of poly (3,4-ethylenedioxythiophene) polystyrene sulfonate ("PEDOT:PSS"), for example; and (ii) any inorganic metal oxides such as oxides of Ni, W, Mo, etc.

As a specific example, embodiments of fabrication techniques for forming an illustrative embodiment of the photovoltaic circuit 12 including three layers involves combining AgNW (silver nanowires) with ZnO or another suitable electron transporting and/or hole blocking material to form the cathode blended material. The cathode blended material including AgNW:ZnO is then coated onto a region of the substrate 25 to form the hybrid electrode 20. According to one embodiment, a blend of P3HT (poly(3-hexylthiophene)):PCBM (phenyl-C61-butyric acid methyl ester) is coated over the cathode blended material film forming the hybrid electrode 20. An AgNW composition is combined with the conjugated polymer PEDOT:PSS to form the anode blended material. The anode blended material is then coated onto the photoactive layer 35 to form the first hybrid electrode 15. The electro-optical properties of these individual layers are analyzed and optimized for OPV device.

Figure 2:
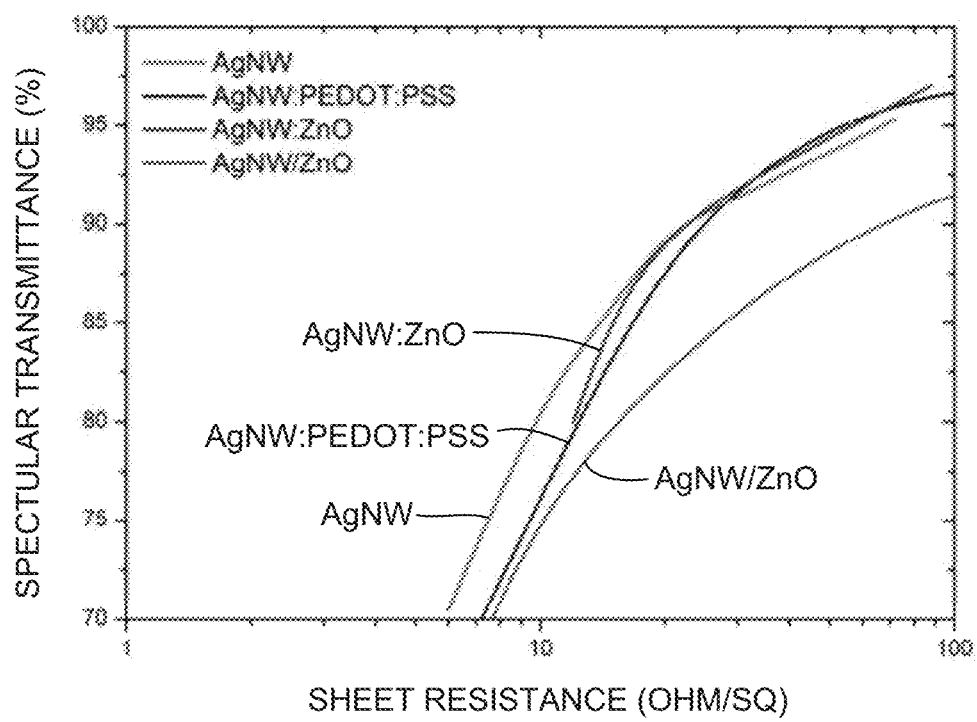
FIG. 2 shows T vs. $R_{sh}$ graphs of electrode/extraction layers double layers and hybrid electrodes.

For the charge selective hybrid electrodes 15, 20 fabricated from formulations including a solution blend of AgNW and the respective charge extraction materials PEDOT:PSS and ZnO nanoparticles, respectively, are used, a comparison of sheet resistance versus transmittance of films fabricated by different combinations of electrodes 15, 20 is shown in FIG. 2. Both types of hybrid electrode 15, 20 exhibit excellent optical transmittance (T) exceeding 90% at low sheet resistance value ($R_{sh}$) of 20 Ω/sq. In particular the hybrid AgNW:ZnO electrode 20 exhibits improved properties compared to conventional bilayer electrodes.

Figure 3:
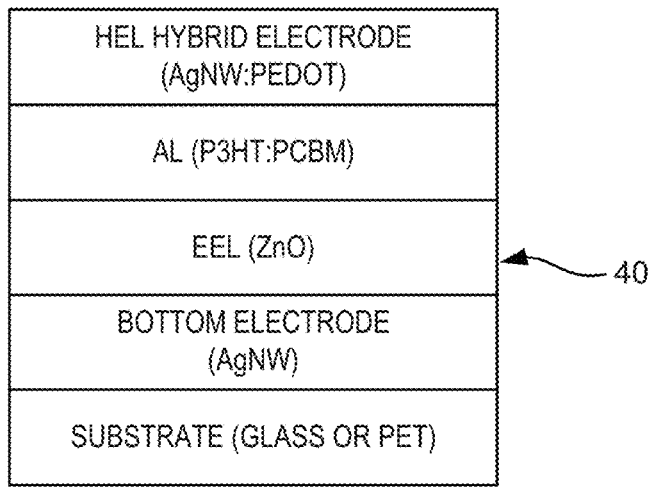
FIG. 3 shows two illustrative embodiments of OPV devices comprising four discrete layers on a substrate.
Figure 3:
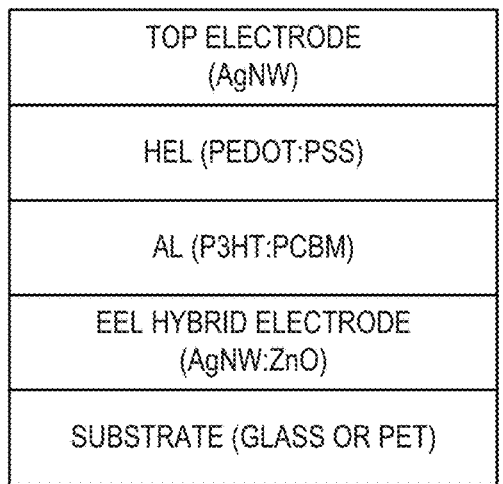
Figure 5:
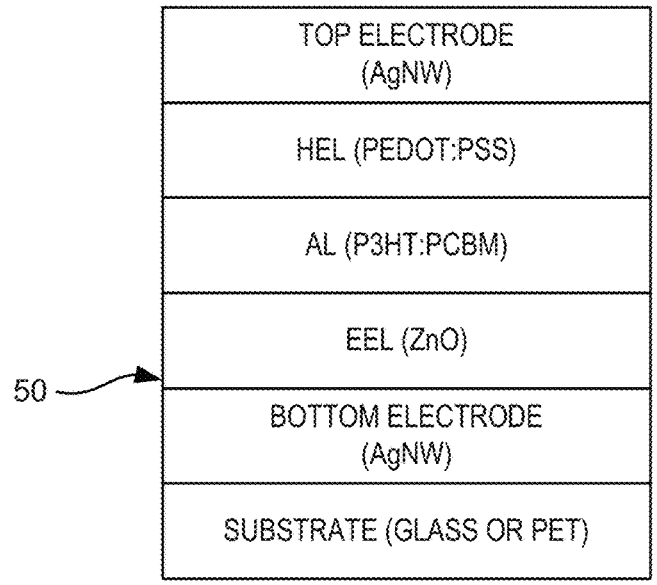
FIG. 5 shows an illustrative embodiment of an OPV device comprising five discrete layers on a substrate.
Figure 4A:
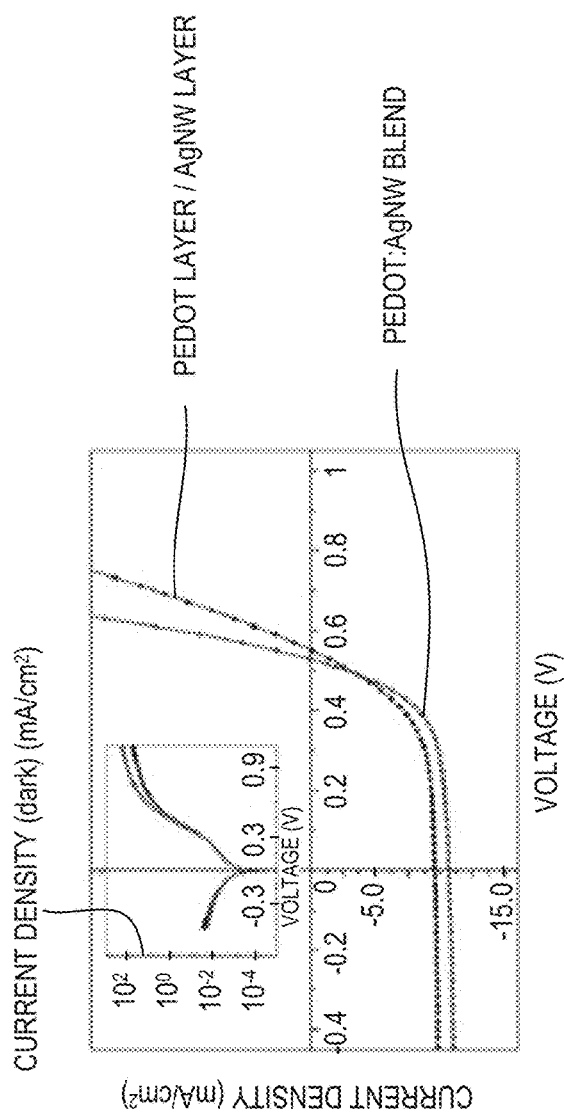
FIG. 4a shows current density-voltage curve of solar cells with PEDOT:AgNW double layers and PEDOT:AgNW blend measured under AM 1.5 illumination, with dark curves of respective devices inset.
Figure 4B:
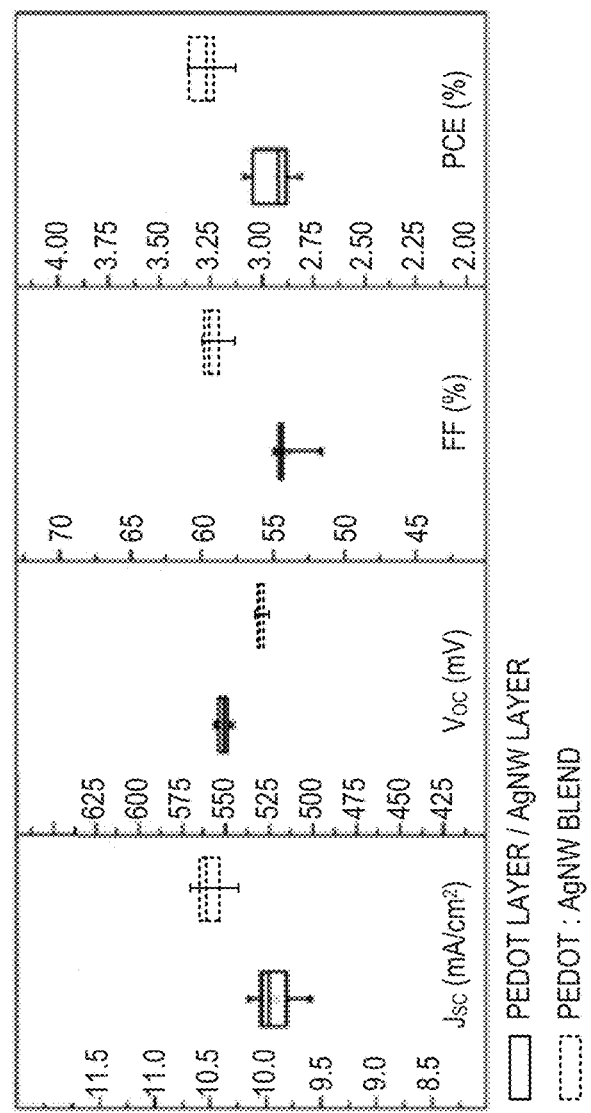
FIG. 4b shows Box plots of major device performance parameters of the two device structures represented in FIG. 4a across six devices each.

The hybrid electrodes were then tested individually with a standard semitransparent four layer structured device 40 structure, two examples of which are shown in FIG. 3 with P3HT:PCBM as the active layer 35 material. FIGS. 4a and 4b show the current density-voltage (J-V) characteristics of the 4-layer structured device 40 in comparison with a five layered device 45, an example of which is shown in FIG. 5. The 4-layer structured device 40 also demonstrates slightly higher performance (power conversion efficiencies of 3.4% vs 2.9%) compared to standard 5-layer structured device, which is believed to be attributable to higher current density and fill factor of the hybrid electrode devices.

Figure 6:
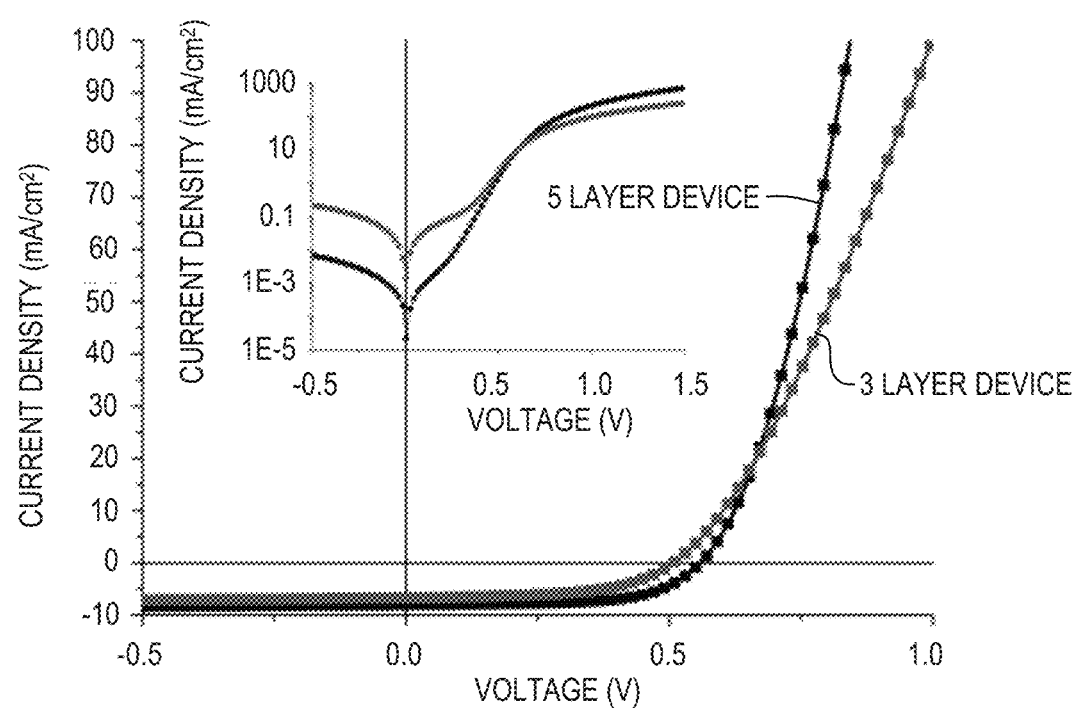
FIG. 6 shows a current density-voltage curve of solar cells with three layer structures and five layer structures measured under AM 1.5 illumination, with dark curves of respective devices inset.

A semitransparent P3HT:PCBM OPV device 10 can be fabricated from a photovoltaic circuit 12 with only three processing layers (FIG. 1) by utilizing both hybrid electrodes. The inverted structure is described in the present embodiment, but in theory normal structured device may also be possible with an exchange in electrodes position. The J-V characteristics of both five layer device 50 and three layer photovoltaic circuit 12 of the structured device 10 are shown in FIG. 6, and the performance parameters of these devices are set forth below in Table 1. The three layer photovoltaic circuit 12 of the structured device 10 has demonstrated very similar performance compared to five layer photovoltaic circuits of the structured device 50 with an efficiency difference of less than 0.1%. This is believed to be attributed to the difference in open circuit voltage and fill factor, which is somewhat offset by the superior short circuit current. The higher $J_{sc}$ is believed to be attributed to the higher transmittance of the bottom electrode which is the incoming light direction. It should also be noted that three layer photovoltaic circuit 12 of the structured device 10 can be fabricated during a process that requires fewer coating and annealing steps than for the five layer photovoltaic circuit of the structure 50 due to the fewer number of layers.

TABLE 1

Performance parameters of the two device structures exhibiting the performance curves shown in FIG. 6.

| | $J_{sc}$ (mA/cm$^2$) | $V_{oc}$ (V) | Fill Factor (%) | Efficiency (%) |
|---|---|---|---|---|
| 5-layer device | 8 | 0.56 | 62.8 | 2.8 |
| 3-layer device | 9.6 | 0.51 | 55.5 | 2.7 |

Accordingly, an OPV device 10 can be fabricated as set forth herein with a photovoltaic circuit 12 comprising a minimal number (e.g., three) discrete layers by solution processing. With correct formulation of the hybrid electrode solution, experimental results show that there are no significant performance impacts of these electrodes on the device performance relative to devices having a greater number of discrete layers. As a result the performance differences between standard five layer structured and three layer structured devices are minimal, yet allow for the use of simplified fabrication and processing techniques. This minimalistic device structure is believed to allow for much easier processing of OPV devices, especially in large device area.

One embodiment of a method of fabricating the hybrid electrodes 15, 20 involves applying the respective coatings to form the hybrid electrodes 15, 20 with a slot die. To prepare the cathode hybrid electrode 20, a mixture of AZO nanoparticles and AgNW is prepared. AZO in a solvent such as isopropyl alcohol ("IPA") is combined with a composition including one (1 wt %) weight percent AgNW in IPA. A high-boiling-point co-solvent (e.g., 10 wt % of 2-butanone) is added to promote the formation of homogeneous layers for the hybrid electrodes 15, 20. The concentration of each component in the blended mixture is expected to be AgNW: AZO 2:1. The blended mixture is then introduced to a slot die, and deposited as a coating onto the substrate 25. The photoactive layer 35 is subsequently formed on the film of the hybrid electrode 20. For the anode hybrid electrode 15, an aqueous composition of AgNW:PEDOT:PSS was prepared by combining a composition of AgNW offered under the trade name ClearOhm® by Cambrios Advanced Materials with the conductive polymer PEDOT:PSS offered under the trade name Clevios™ by Heraeus. The aqueous composition was then applied onto a region of the photoactive layer 35 using a slot die.

Instead of, or in combination with a slot die, an inkjet printer can apply the films of materials for the hybrid electrodes 15, 20. For such embodiments, the material for the cathode hybrid electrode 20 is prepared as a mixture of Al-doped AZO nanoparticles and AgNW. The AZO nanoparticles in IPA are combined with a composition including 0.4 wt. % AgNW in IPA. A secondary solvent of 1-Pentanol is added to prolong the time required for the mixture to dry relative to the time that would be required for the mixture to dry without the secondary solvent. Prolonging the drying time in this manner protects against clogging of the inkjet nozzles. The resulting concentration of the components in the blended mixture is expected to be AgNW:AZO:Pentanol 2:1:3. The blended mixture can then introduced to an ink reservoir and applied as a coating onto the substrate 25 via the inkjet nozzles. The photoactive layer 35 is subsequently formed on the film of the hybrid electrode 20. For the anode hybrid electrode 15, an aqueous composition of AgNW: PEDOT:PSS was prepared by combining a composition of AgNW offered under the trade name ClearOhm® by Cambrios Advanced Materials with the conductive polymer PEDOT:PSS offered under the trade name Clevios™ by Heraeus. The aqueous composition was then introduced into an ink reservoir and applied onto a region of the photoactive layer 35 via the inkjet nozzles.

Although the OPV device 10 shown in FIG. 1 includes a single photovoltaic circuit 12, the present disclosure is not so limited. According to alternate embodiments, the OPV device 10 can optionally include a plurality of photovoltaic circuits 12, vertically aligned in a stacked arrangement (e.g., tandem or triple stacks). Such OPV devices 10 can include one or both of the hybrid electrodes 15, 20 as the outermost anode and/or cathode, respectively. Further, the OPV device 10 can be formed as discrete, individual photo-voltaic cells or arrangements or photo-voltaic modules including series-connected photo-voltaic cells.

Unless specified otherwise, "first," "second," and/or the like are not intended to imply a temporal aspect, a spatial aspect, an ordering, etc. Rather, such terms are merely used as identifiers, names, etc. for features, elements, items, etc. For example, a first object and a second object generally correspond to object A and object B or two different or two identical objects or the same object.

Moreover, "example" is used herein to mean serving as an instance, illustration, etc., and not necessarily as advantageous. As used herein, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", and/or variants thereof are used in either the detailed description or the claims, such terms are intended to be inclusive in a manner similar to the term "comprising".

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing at least some of the claims.

Various operations of embodiments are provided herein. The order in which some or all of the operations are described herein should not be construed as to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. An organic photovoltaic device comprising:
a substrate; and
a photovoltaic circuit supported by the substrate, the photovoltaic circuit comprising three layers, the three layers comprising:
a first hybrid electrode formed from a blend of first electrically conductive nanowires and a hole transporting and/or electron blocking material that carries positive charges, wherein the first electrically conductive nanowires are embedded in the hole transporting and/or electron blocking material,
a second hybrid electrode formed from a blend of second electrically conductive nanowires and an electron transporting and/or hole blocking material that carries negative charges, wherein the second electrically conductive nanowires are embedded in the electron transporting and/or hole blocking material, and
a photoactive layer disposed between the first hybrid electrode and the second hybrid electrode.

2. The organic photovoltaic device of claim 1, wherein the first hybrid electrode is substantially transparent, and the hole transporting and/or electron blocking material comprises a conjugated polymer that includes PEDOT.

3. The organic photovoltaic device of claim 1, wherein the second hybrid electrode is substantially transparent, and the electron transporting and/or hole blocking material comprises an inorganic semiconducting material.

4. The organic photovoltaic device of claim 1, wherein the photoactive layer is a blend of P3HT:PCBM.

5. The organic photovoltaic device of claim 1, wherein the hole transporting and/or electron blocking material comprises an inorganic metal oxide.

6. The organic photovoltaic device of claim 5, wherein the inorganic metal oxide comprises an oxide of one or more metals selected from the group consisting of Ni, W, or Mo.

7. The organic photovoltaic device of claim 1, wherein the electron transporting and/or hole blocking material comprises a metal oxide.

8. The organic photovoltaic device of claim 7, wherein the metal oxide is an oxide of one or more metals selected from the group consisting of Zn, Sn, or Ti.

9. The organic photovoltaic device of claim 7, wherein the metal oxide is doped with Al or Sb.

10. The organic photovoltaic device of claim 1, wherein the electron transporting and/or hole blocking material comprises an organic polymer.

11. The organic photovoltaic device of claim 10, wherein the organic polymer is non-conjugated polyethylenimine ethoxylated.

12. An organic photovoltaic device comprising:
a substrate that is substantially transparent; and
a photovoltaic circuit supported by the substrate, the photovoltaic circuit comprising a planar assembly of circuit layers, wherein the planar assembly of circuit layers consists essentially of:
a first hybrid electrode formed from a blend of first silver nanowires and a conjugated polymer that carries positive charges, wherein the first silver nanowires are embedded in the conjugated polymer,
a second hybrid electrode formed from a blend of second silver nanowires and an inorganic semiconducting material, wherein the second hybrid electrode carries negative charges, and the second silver nanowires are embedded in the inorganic semiconducting material, and
a photoactive layer disposed between the first hybrid electrode and the second hybrid electrode, the photoactive layer being formed from a composition comprising an organic photoactive material.

13. A method of forming an organic photovoltaic device, the method comprising:
forming a hybrid cathode layer in stacked alignment with a substrate, the hybrid cathode layer comprising a combination of first electrically conductive nanowires and an electron-transport material, wherein the electron-transport material exhibits a preference to conduct electrons and impede a flow of holes, and the first electrically conductive nanowires are embedded in the electron-transport material;
after forming the hybrid cathode layer, forming a photoactive layer on a structure comprising the substrate and the hybrid cathode layer; and
after forming the photoactive layer, forming a hybrid anode layer that is separated from the hybrid cathode layer by the photoactive layer, the hybrid anode layer comprising a combination of second electrically conductive nanowires and a hole-transporting material, wherein the hole-transporting material exhibits a preference to conduct holes and impede a flow of electrons, and the second electrically conductive nanowires are embedded in the hole-transporting material.

14. The method of claim 13, wherein the first electrically conductive nanowires are silver nanowires, the electron-transport material is a metal oxide, and forming the hybrid cathode layer comprises coating a surface of the substrate with a combination comprising a blend of the silver nanowires and the metal oxide.

15. The method of claim 14, wherein the metal oxide is doped with Al or Sb.

16. The method of claim 13, wherein forming the photoactive layer comprises coating a surface of the hybrid cathode layer with a composition comprising an organic photoactive material.

17. The method of claim 16, wherein the organic photoactive material comprises a blend comprising P3HT:PCBM.

18. The method of claim 13, wherein forming the photoactive layer comprises coating a surface of the hybrid cathode layer with a composition comprising an inorganic photoactive material, and the inorganic photoactive material comprises a blend comprising an inorganic perovskite material.

19. The method of claim 13, wherein the second electrically conductive nanowires comprise silver nanowires, the hole-transporting material comprises a conjugated polymer composition comprising PEDOT:PSS, and forming the hybrid anode layer comprises coating a surface of the photoactive layer with a blend of the silver nanowires and the conjugated polymer composition comprising PEDOT:PSS.

20. The organic photovoltaic device of claim 1, wherein a ratio of the second electrically conductive nanowires to the hole transporting and/or electron blocking material is about 2:1.

* * * * *